United States Patent
Venkatasubramanian et al.

(10) Patent No.: US 11,043,372 B2
(45) Date of Patent: Jun. 22, 2021

(54) HIGH-DENSITY LOW TEMPERATURE CARBON FILMS FOR HARDMASK AND OTHER PATTERNING APPLICATIONS

(71) Applicant: Applied Materials, Inc., Santa Clara, CA (US)

(72) Inventors: Eswaranand Venkatasubramanian, Santa Clara, CA (US); Samuel E. Gottheim, Santa Clara, CA (US); Yang Yang, San Diego, CA (US); Pramit Manna, Sunnyvale, CA (US); Kartik Ramaswamy, San Jose, CA (US); Takehito Koshizawa, San Jose, CA (US); Abhijit Basu Mallick, Fremont, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/979,842

(22) Filed: May 15, 2018

(65) Prior Publication Data
US 2018/0358222 A1   Dec. 13, 2018

Related U.S. Application Data

(60) Provisional application No. 62/516,828, filed on Jun. 8, 2017.

(51) Int. Cl.
*H01L 21/683* (2006.01)
*H01L 21/033* (2006.01)
(Continued)

(52) U.S. Cl.
CPC ........ *H01L 21/02115* (2013.01); *C23C 16/26* (2013.01); *C23C 16/272* (2013.01);
(Continued)

(58) Field of Classification Search
CPC .......... H01L 21/02115; H01L 21/6833; H01L 21/0337
See application file for complete search history.

(56) References Cited

U.S. PATENT DOCUMENTS

| 4,783,368 A | 11/1988 | Yamamoto et al. |
| 5,688,382 A | 11/1997 | Besen et al. |

(Continued)

FOREIGN PATENT DOCUMENTS

| KR | 20110115291 A | 10/2011 |
| KR | 10-2012-0121340 A | 11/2012 |
| TW | 468209 B | 12/2001 |

OTHER PUBLICATIONS

International Search Report dated Sep. 5, 2018 for Application No. PCT/US2018/032684.

*Primary Examiner* — Khaja Ahmad
*Assistant Examiner* — Khatib A Rahman
(74) *Attorney, Agent, or Firm* — Patterson + Sheridan, LLP

(57) ABSTRACT

Implementations of the present disclosure generally relate to the fabrication of integrated circuits. More particularly, the implementations described herein provide techniques for deposition of high-density films for patterning applications. In one implementation, a method of processing a substrate is provided. The method includes flowing a hydrocarbon-containing gas mixture into a processing volume of a process chamber having a substrate positioned on an electrostatic chuck. The substrate is maintained at a pressure between about 0.5 mTorr and about 10 Torr. The method further includes generating a plasma at the substrate level by applying a first RF bias to the electrostatic chuck to deposit a diamond-like carbon film on the substrate. The diamond-like carbon film has a density greater than 1.8 g/cc and a stress less than −500 MPa.

19 Claims, 8 Drawing Sheets

(51) Int. Cl.
*H01L 21/02* (2006.01)
*H01L 21/311* (2006.01)
*H01J 37/32* (2006.01)
*C23C 16/27* (2006.01)
*C23C 16/505* (2006.01)
*C23C 16/56* (2006.01)
*G03F 7/20* (2006.01)
*H01L 21/67* (2006.01)
*C23C 16/458* (2006.01)
*C23C 16/26* (2006.01)
*H01L 27/11551* (2017.01)
*H01L 27/11578* (2017.01)
*H01L 27/11582* (2017.01)
*H01L 27/11556* (2017.01)

(52) U.S. Cl.
CPC ........ *C23C 16/4586* (2013.01); *C23C 16/505* (2013.01); *C23C 16/56* (2013.01); *G03F 7/70033* (2013.01); *H01J 37/32082* (2013.01); *H01J 37/32715* (2013.01); *H01L 21/02274* (2013.01); *H01L 21/0332* (2013.01); *H01L 21/0335* (2013.01); *H01L 21/0337* (2013.01); *H01L 21/31111* (2013.01); *H01L 21/31144* (2013.01); *H01L 21/67103* (2013.01); *H01L 21/6831* (2013.01); *H01L 21/6833* (2013.01); *H01J 2237/3321* (2013.01); *H01L 21/67248* (2013.01); *H01L 27/11551* (2013.01); *H01L 27/11556* (2013.01); *H01L 27/11578* (2013.01); *H01L 27/11582* (2013.01)

(56) References Cited

U.S. PATENT DOCUMENTS

| | | | |
|---|---|---|---|
| 7,166,336 B1 * | 1/2007 | Mori | C23C 16/045 427/577 |
| 8,105,660 B2 | 1/2012 | Tudhope et al. | |
| 8,361,906 B2 | 1/2013 | Lee et al. | |
| 9,695,593 B2 | 7/2017 | Vokey et al. | |
| 10,249,495 B2 | 4/2019 | Yang et al. | |
| 2002/0130407 A1 * | 9/2002 | Dahl | C07C 7/12 257/712 |
| 2003/0180459 A1 * | 9/2003 | Redeker | H01L 21/6831 427/248.1 |
| 2004/0026235 A1 | 2/2004 | Stowell | |
| 2006/0264063 A1 | 11/2006 | Stern et al. | |
| 2007/0104867 A1 | 5/2007 | Haba | |
| 2008/0053819 A1 | 3/2008 | Hong et al. | |
| 2008/0099326 A1 | 5/2008 | Ye et al. | |
| 2009/0029067 A1 * | 1/2009 | Sciamanna | C23C 16/26 427/577 |
| 2009/0212010 A1 | 8/2009 | Wang et al. | |
| 2010/0209627 A1 * | 8/2010 | Tabat | C23C 16/26 427/595 |
| 2011/0005681 A1 * | 1/2011 | Savas | H01J 37/32036 156/345.33 |
| 2011/0274852 A1 | 11/2011 | Ito et al. | |
| 2012/0276743 A1 * | 11/2012 | Won | H01L 27/10817 438/694 |
| 2013/0146443 A1 | 6/2013 | Papa et al. | |
| 2014/0054658 A1 * | 2/2014 | Ma | H01L 21/26506 257/288 |
| 2014/0170853 A1 | 6/2014 | Shamma et al. | |
| 2015/0348794 A1 * | 12/2015 | Kim | G03F 7/40 438/703 |
| 2015/0348824 A1 * | 12/2015 | Kuenle | H01L 21/02631 257/506 |
| 2015/0371851 A1 * | 12/2015 | Lee | H01J 37/32091 438/694 |
| 2016/0053366 A1 | 2/2016 | Stowell et al. | |
| 2016/0147141 A1 * | 5/2016 | Ono | G03F 7/7015 430/5 |
| 2016/0149128 A1 * | 5/2016 | Bodke | H01L 45/149 257/4 |
| 2016/0179005 A1 | 6/2016 | Shamma et al. | |
| 2016/0372307 A1 | 12/2016 | Yang et al. | |
| 2017/0103893 A1 * | 4/2017 | Kulshreshtha | H01L 21/3065 |
| 2019/0385907 A1 * | 12/2019 | Gottheim | H01L 21/02266 |

* cited by examiner

HIGH-DENSITY LOW TEMPERATURE CARBON FILMS FOR HARDMASK AND OTHER PATTERNING APPLICATIONS

CROSS-REFERENCE TO RELATED APPLICATIONS

This application claims benefit of U.S. Provisional Patent Application Ser. No. 62/516,828, filed Jun. 8, 2017, which is incorporated herein by reference in its entirety.

BACKGROUND

Field

Implementations of the present disclosure generally relate to the fabrication of integrated circuits. More particularly, the implementations described herein provide techniques for deposition of high-density films for patterning applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components reduce to the sub-micron scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer step due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the desired etch selectivity relative to underlying materials (e.g., oxides and nitrides) and are often difficult to deposit.

Therefore, there is a need in the art for an improved hardmask layers and methods for depositing improved hardmask layers.

SUMMARY

Implementations of the present disclosure generally relate to the fabrication of integrated circuits. More particularly, the implementations described herein provide techniques for deposition of high-density films for patterning applications. In one implementation, a method of processing a substrate is provided. The method includes flowing a hydrocarbon-containing gas mixture into a processing volume of a process chamber having a substrate positioned on an electrostatic chuck. The substrate is maintained at a pressure between about 0.5 mTorr and about 10 Torr. The method further includes generating a plasma at the substrate level by applying a first RF bias to the electrostatic chuck to deposit a diamond-like carbon film on the substrate. The diamond-like carbon film has a density greater than 1.8 g/cc and a stress less than −500 MPa.

In another implementation, a method of processing a substrate is provided. The method includes flowing a hydrocarbon-containing gas mixture into a processing volume of a process chamber having a substrate positioned on an electrostatic chuck. The substrate is maintained at a pressure between about 0.5 mTorr and about 10 Torr and the hydrocarbon-containing gas mixture comprises acetylene ($C_2H_2$). The method further includes generating a plasma at the substrate level by applying a first RF bias and a second RF bias to the electrostatic chuck to deposit a diamond-like carbon film on the substrate. The diamond-like carbon film has a density greater from about 1.8 g/cc to about 2.5 g/cc and a stress from approximately −600 MPa to approximately −300 MPa.

In yet another implementation, a method of processing a substrate is provided. The method includes flowing a hydrocarbon-containing gas mixture into a processing volume of a process chamber having a substrate positioned on an electrostatic chuck. The processing volume is maintained at a pressure between about 0.5 mTorr and about 10 Torr. The method further includes generating a plasma at the substrate level by applying a first RF bias and a second RF bias to the electrostatic chuck to deposit a diamond-like carbon film on the substrate. The diamond-like carbon film has a density greater from about 1.8 g/cc to about 2.5 g/cc and a stress from approximately −1000 MPa to approximately −100 MPa, for example from approximately −600 MPa to approximately −300 MPa. The method further includes forming a patterned photoresist layer over the diamond-like carbon film. The method further includes etching the diamond-like carbon in a pattern corresponding with the patterned photoresist layer. The method further includes etching the pattern into the substrate. The method further includes depositing a material into the etched portions of the diamond-like carbon film.

In yet another implementation, a film for use as an underlayer for a EUV lithography process is provided. The film has an $sp^3$ hybridized carbon atom content of between 40% and 90% based on the total amount of carbon atoms in the film; a density of between 1.8 g/cc and 2.5 g/cc; and an elastic modulus that is between 150 GPa and 400 GPa. In some implementations, the film has a density of between 2.0 g/cc and 2.5 g/cc and an elastic modulus that is between 180 GPa and 200 GPa. In some implementations, the film has a stress of −600 MPa; a refractive index that is between 2.0 and 3.0; and an extinction coefficient of between 0.2 and 0.3.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
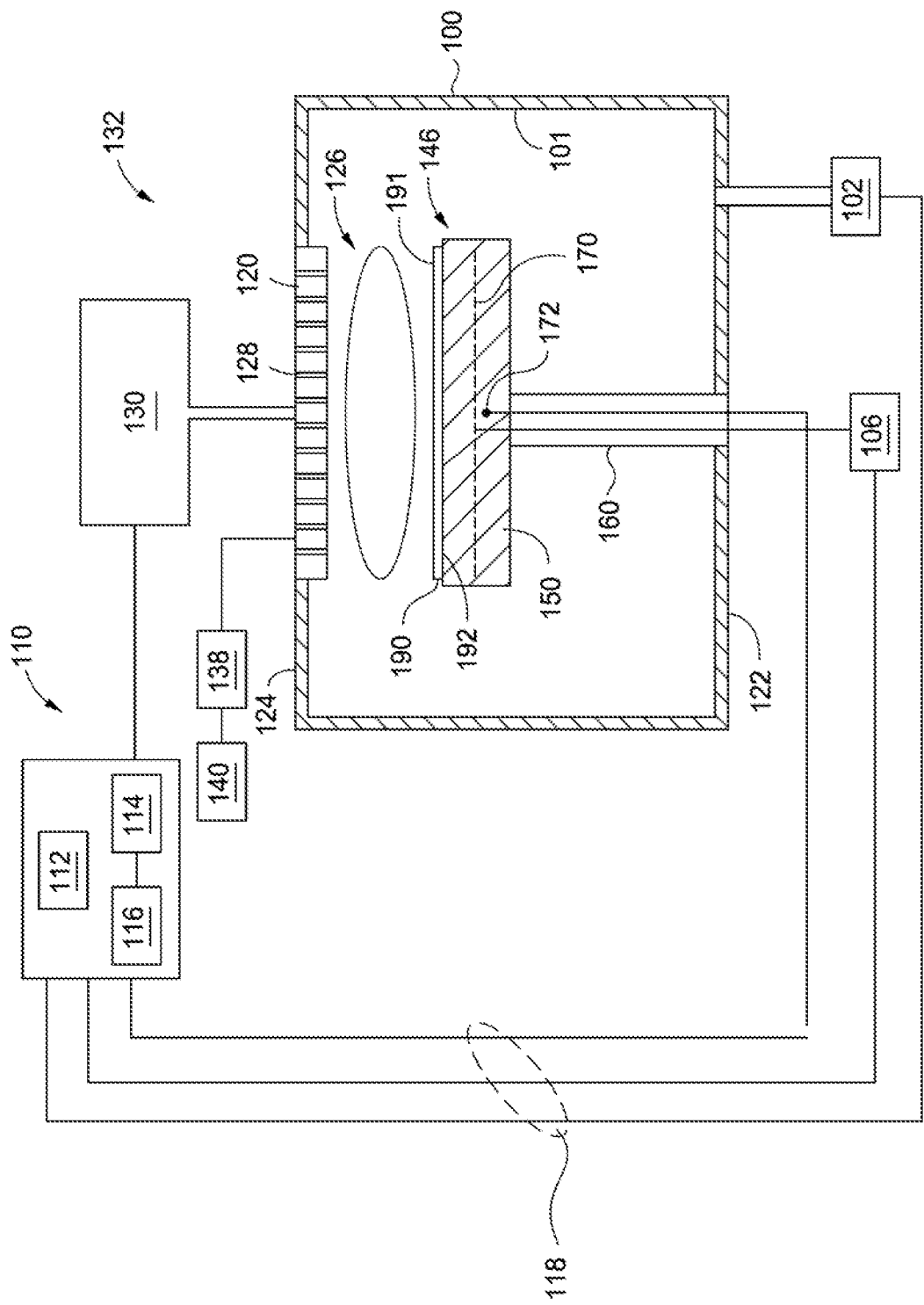
FIG. 1A depicts a schematic cross-sectional view of a deposition system that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of diamond-like carbon films on a substrate. Certain details are set forth in the following description and in FIGS. 1-7 to provide a thorough understanding of various implementations of the disclosure. Other details describing well-known structures and systems often associated with plasma processing and diamond-like carbon film deposition are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Current hardmask applications for memory and other devices largely make use of thick carbon films (e.g., 300 nanometers to 1.5 microns) that are amorphous in nature but their etch selectivity is no longer sufficient to meet the increasingly stringent requirements and the high-aspect ratio etch of the upcoming nodes. To achieve greater etch selectivity, the density and the Young's modulus of the film needs to be improved. One of the main challenges in achieving greater etch selectivity and improved Young's modulus is the high compressive stress of such a film making it unsuitable for applications owing to the resultant high wafer bow. Hence there is a need for carbon (diamond-like) films with high-density and modulus (e.g., higher $sp^3$ content, more diamond-like) with high etch selectivity along with low stress (e.g., <−500 MPa).

Implementations described herein, include improved methods of fabricating carbon films with high-density (e.g., >1.8 g/cc), high modulus (e.g., >150 GPa), and low stress (e.g., <−500 MPa). The carbon films fabricated according to the implementations described herein are amorphous in nature and have a higher etch selectivity with much greater modulus (e.g., >150 GPa) along with lower stress (<−500 MPa) than current patterning films. The carbon films fabricated according to the implementations described herein not only have a low stress but also have a high $sp^3$ carbon content. In general, the deposition process described herein is also fully compatible with current integration schemes for hardmask applications.

In some implementations, the diamond-like carbon films described herein may be formed by chemical vapor deposition (plasma enhanced and/or thermal) processes using hydrocarbon-containing gas mixtures including precursors such as but not limited to $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof. The deposition process may be carried out at temperatures ranging from −50 degrees Celsius to 600 degrees Celsius. The deposition process may be carried out at pressures ranging from 0.1 mTorr to 10 Torr in a processing volume. The hydrocarbon-containing gas mixture may further include any one of, or a combination of any of He, Ar, Xe, $N_2$, $H_2$. The hydrocarbon-containing gas mixture may further include etchant gases such as $Cl_2$, $CF_4$, and/or $NF_3$ to improve film quality. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of diamond-like carbon for use as a hardmask and/or etch stop or any other application requiring smooth carbon films. The high etch selectivity of the diamond-like carbon film is achieved by having higher density and modulus than current generation films. Not to be bound by theory but it is believed that the higher density and modulus are a result of the high content of $sp^3$ hybridized carbon atoms in the film, which in turn may be achieved by a combination of low pressure and plasma power.

In some implementations, hydrogen radical are fed through an RPS, which leads to selective etching of $sp^2$ hybridized carbon atoms thus increasing the $sp^3$ hybridized carbon atom fraction of the film further, thus further increasing the etch selectivity.

In some implementations, the diamond-like carbon film was deposited in a chamber with substrate pedestal maintained at 10 degrees Celsius and the pressure was maintained at 2 mTorr, with plasma generated at the wafer level by applying a bias of 2500 Watts (13.56 MHz) to the electrostatic chuck. In some implementations, an additional RF of 1000 Watts at 2 MHz was also delivered to the electrostatic chuck thus generating a dual-bias plasma at the wafer level.

In some implementations, a film for use as an underlayer for an EUV lithography process can be any film described herein.

In some implementations, a film for use as an underlayer for an EUV lithography process has an $sp^3$ hybridized carbon atom content of between 40% and 90% based on the total amount of carbon atoms in the film; a density of between 1.8 g/cc and 2.5 g/cc; and an elastic modulus that is between 150 GPa and 400 GPa.

In some implementations, a film for use as an underlayer for an EUV lithography process has a density of between 2.0 g/cc and 2.2 g/cc; and an elastic modulus that is between about 180 GPa and about 200 GPa. In some implementations, the film has a density of about 2.1 g/cc and an elastic modulus of about 195 GPa.

In some implementations, for use as an underlayer for an EUV lithography process has a stress of −600 MPa; a refractive index that is between 2.0 and 3.0; and an extinction coefficient of between 0.2 and 0.3.

FIG. 1A depicts a schematic illustration of a substrate processing system 132 that can be used to perform diamond-like carbon layer deposition in accordance with implementations described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the processing volume 126 during processing. A plasma is formed from the process gas mixture exiting the gas distribution assembly 120 to enhance thermal decomposition of the process gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some implementations, the RF power source 140 may produce power at a frequency of 350 KHz, 2 MHz, 13.56 MHz, 27 MHz, 40 MHz, 60 MHz, or 100 MHz. In one implementation, the RF power source 140 may provide between about 100 Watts and about 3,000 Watts at a frequency of about 50 kHz to about 13.6 MHz. In another implementation, the RF power source 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1A.

Figure 1B:
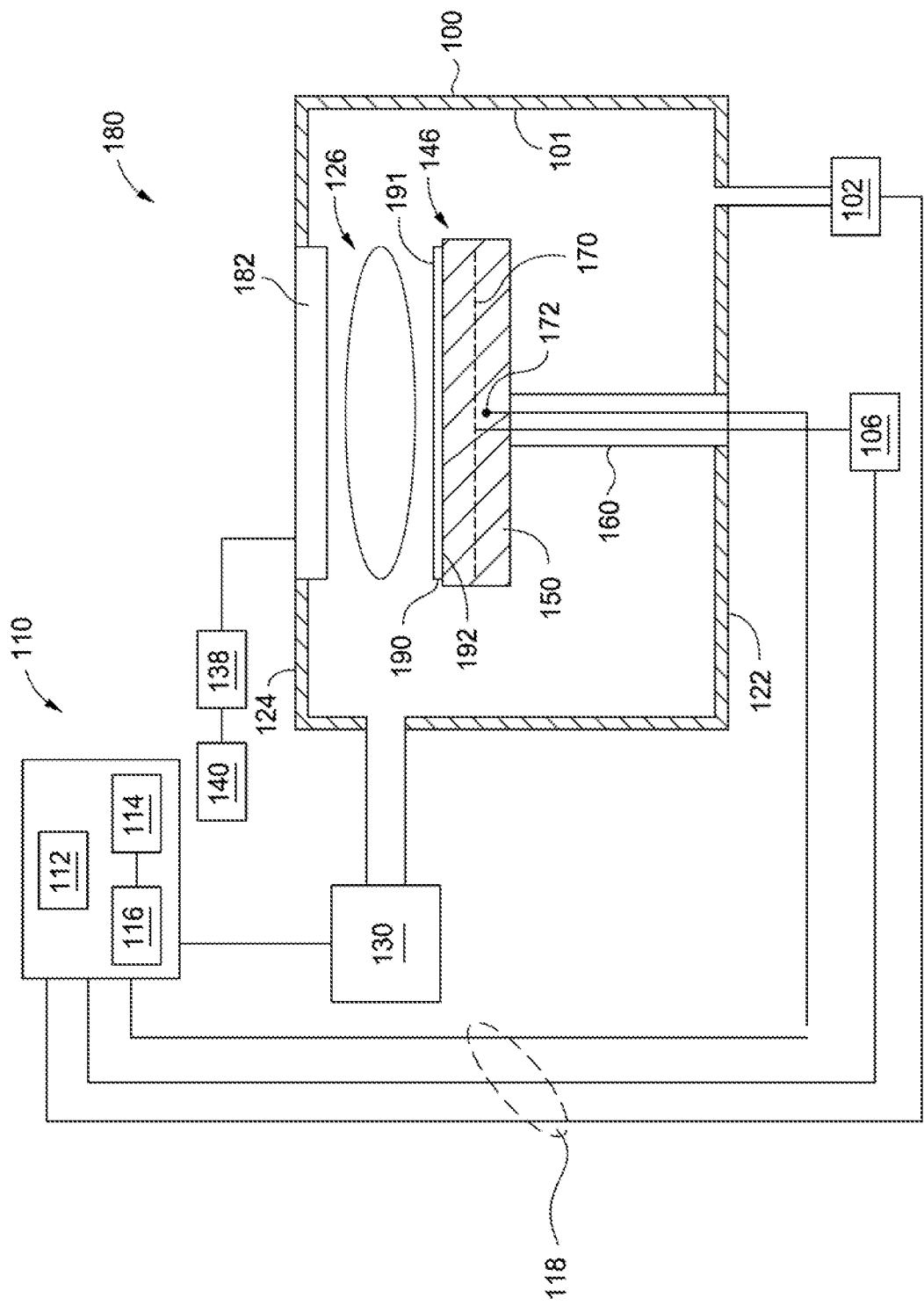
FIG. 1B depicts a schematic cross-sectional view of another deposition system that can be used for the practice of implementations described herein.

FIG. 1B depicts a schematic cross-sectional view of another substrate processing system 180 that can be used for the practice of implementations described herein. The substrate processing system 180 is similar to the substrate processing system 132 of FIG. 1A, except that the substrate processing system 180 is configured to flow processing gases from gas panel 130 across the surface 191 of the substrate 190 via the sidewall 101. In addition, the gas distribution assembly 120 depicted in FIG. 1A is replaced with an electrode 182. The electrode 182 may be configured for secondary electron generation. In one implementation, the electrode 182 is a silicon-containing electrode.

Figure 2:
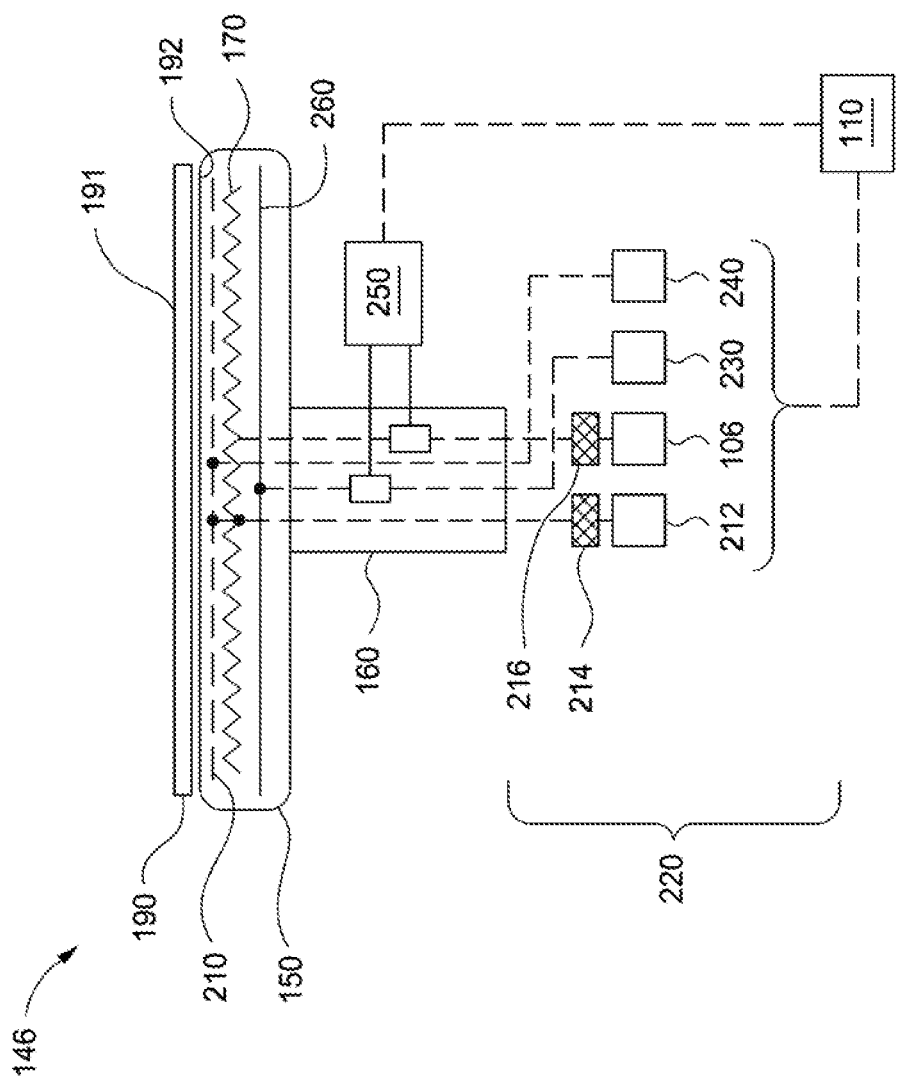
FIG. 2 depicts a schematic cross-sectional view of an electrostatic chuck that may be used in the apparatus of FIG. 1A and FIG. 1B for the practice of implementations described herein.

FIG. 2 depicts a schematic cross-sectional view of the substrate support assembly 146 used in the processing systems of FIG. 1A and FIG. 1B that can be used for the practice of implementations described herein. Referring to FIG. 2, the electrostatic chuck 150 may include a heater element 170 suitable for controlling the temperature of a substrate 190 supported on an upper surface 192 of the electrostatic chuck 150. The heater element 170 may be embedded in the electrostatic chuck 150. The electrostatic chuck 150 may be resistively heated by applying an electric current from a heater power source 106 to the heater element 170. The heater power source 106 may be coupled through an RF filter 216. The RF filter 216 may be used to protect the heater power source 106 from RF energy. The heater element 170 may be made of a nickel-chromium wire encapsulated in a nickel-iron-chromium alloy (e.g., INCOLOY®) sheath tube. The electric current supplied from the heater power source 106 is regulated by the controller 110 to control the heat generated by the heater element 170, thus maintaining the substrate 190 and the electrostatic chuck 150 at a substantially constant temperature during film deposition. The supplied electric current may be adjusted to selectively control the temperature of the electrostatic chuck 150 between about −50 degrees Celsius to about 600 degrees Celsius.

Referring to FIG. 1, a temperature sensor 172, such as a thermocouple, may be embedded in the electrostatic chuck 150 to monitor the temperature of the electrostatic chuck 150 in a conventional manner. The measured temperature is used by the controller 110 to control the power supplied to the heater element 170 to maintain the substrate at a desired temperature.

The electrostatic chuck 150 includes a chucking electrode 210, which may be a mesh of a conductive material. The chucking electrode 210 may be embedded in the electrostatic chuck 150. The chucking electrode 210 is coupled to a chucking power source 212 that, when energized, electrostatically clamps the substrate 190 to the upper surface 192 of the electrostatic chuck 150.

The chucking electrode 210 may be configured as a monopolar or bipolar electrode, or have another suitable arrangement. The chucking electrode 210 may be coupled through an RF filter 214 to the chucking power source 212, which provides direct current (DC) power to electrostatically secure the substrate 190 to the upper surface 192 of the electrostatic chuck 150. The RF filter 214 prevents RF power utilized to form plasma within the process chamber 100 from damaging electrical equipment or presenting an electrical hazard outside the chamber. The electrostatic chuck 150 may be fabricated from a ceramic material, such as AlN or $Al_2O_3$. Alternately, the electrostatic chuck 150 may be fabricated from a polymer, such as polyimide, polyetheretherketone (PEEK), polyaryletherketone (PAEK), and the like.

A power application system 220 is coupled to the substrate support assembly 146. The power application system 220 may include the heater power source 106, the chucking power source 212, a first radio frequency (RF) power source 230, and a second RF power source 240. Implementations of the power application system 220 may additionally include the controller 110, and a sensor device 250 that is in communication with the controller 110 and both of the first RF power source 230 and the second RF power source 240.

The controller 110 may also be utilized to control the plasma from the processing gas by application of RF power from the first RF power source 230 and the second RF power source 240 in order to deposit a layer of material on the substrate 190.

As described above, the electrostatic chuck 150 includes the chucking electrode 210 that may function in one aspect to chuck the substrate 190 while also functioning as a first RF electrode. The electrostatic chuck 150 may also include a second RF electrode 260, and together with the chucking electrode 210, may apply RF power to tune the plasma. The first RF power source 230 may be coupled to the second RF electrode 260 while the second RF power source 240 may be coupled to the chucking electrode 210. A first matching network and a second matching network may be provided for the first RF power source 230 and the second RF power source 240, respectively. The second RF electrode 260 may be a solid metal plate of a conductive material as shown. Alternatively, the second RF electrode 260 may be a mesh of conductive material.

The first RF power source 230 and the second RF power source 240 may produce power at the same frequency or a different frequency. In some implementations, one or both of the first RF power source 230 and the second RF power source 240 may independently produce power at a frequency from about 350 KHz to about 100 MHz (e.g., 350 KHz, 2 MHz, 13.56 MHz, 27 MHz, 40 MHz, 60 MHz, or 100 MHz). In some implementations, the first RF power source 230 may produce power at a frequency of 13.56 MHz and the second RF power source 240 may produce power at a frequency of 2 MHz, or vice versa. RF power from one or both of the first RF power source 230 and second RF power source 240 may be varied in order to tune the plasma. For example, the sensor device 250 may be used to monitor the RF energy from one or both of the first RF power source 230 and the second RF power source 240. Data from the sensor device 250 may be communicated to the controller 110, and the controller 110 may be utilized to vary power applied by the first RF power source 230 and the second RF power source 240.

The quantity/percentage of $sp^3$ hybridized carbon atoms in the as-deposited diamond-like carbon may vary from application to application. In various implementations of the present disclosure, the as-deposited diamond-like carbon film may contain at least 40, 45, 50, 55, 60, 65, 70, 75, 80, or 85 percent of $sp^3$ hybridized carbon atoms. The as-deposited diamond-like carbon film may contain up to 45, 50, 55, 60, 65, 70, 75, 80, 85, or 90 percent of $sp^3$ hybridized carbon atoms. The as-deposited diamond-like carbon film may contain from about 50 to about 90 percent of $sp^3$ hybridized carbon atoms. The as-deposited diamond-like carbon film may contain from about 60 to about 70 percent of $sp^3$ hybridized carbon atoms.

In general, the following exemplary deposition process parameters may be used to form the as-deposited diamond-like carbon layer. The wafer temperature may range from about −50° C. to about 350° C. (e.g., from about 10° C. to about 100° C.; or from about 10° C. to about 50° C.). The chamber pressure may range from a chamber pressure of about 0.5 mTorr to about 10 Torr (e.g., about 2 mTorr to about 50 mTorr; or between about 2 mTorr and about 10 mTorr). The flow rate of the hydrocarbon-containing gas mixture may be from about 10 sccm to about 1,000 sccm (e.g., from about 100 sccm to about 200 sccm, or from about 150 sccm to about 200 sccm). The flow rate of a dilution gas may individually range from about 50 sccm to about 50,000 sccm (e.g., from about 50 sccm to about 500 sccm; or from about 50 sccm to about 100 sccm).

TABLE I

| Deposition Parameter | Exemplary Range | Exemplary Range | Exemplary Range |
|---|---|---|---|
| Temperature (° C.) | −50-350° C. | 10-100° C. | 10-50° C. |
| Pressure (Torr) | 0.5 mTorr-10 Torr | 2 mTorr-50 mTorr | 2 mTorr-10 mTorr |
| First RF Power (13.56 MHz) | 100-3,000 Watts | 2,000-3,000 Watts | 2,500 Watts |
| Second RF Power (2 MHz) | 200-2,000 Watts | 800-1,200 Watts | 1,000 Watts |
| Spacing | 1,000 to 15,000 mils | 6,000 to 12,000 mils | 8,000 to 12,000 mils |
| $C_2H_2$ flow | 10-1,000 sccm | 100-200 sccm | 150 sccm |
| He flow | 50-5,000 sccm | 50-100 sccm | 100 sccm |

The diamond-like carbon layer may be deposited to a thickness between about 5 Å and about 20,000 Å (e.g., between about 300 Å to about 5000 Å; between about 2000 Å and about 3000 Å, or between about 5 Å to about 200 Å). The above process parameters depicted in Table I provide examples of process parameters for a 300 mm substrate in a deposition chamber available from Applied Materials, Inc. of Santa Clara, Calif.

The as-deposited diamond-like carbon film may have a refractive index or n-value (n (at 633 nm)) greater than 2.0, for example, approximately 2.0 to approximately 3.0, such as 2.3. The as-deposited diamond-like carbon film may have an extinction coefficient or k-value (K (at 633 nm)) greater than 0.1, for example, approximately 0.2 to approximately 0.3, such as 0.25. The as-deposited diamond-like carbon film may have a stress (MPa) less than about −100 MPa, for example from approximately −1000 MPa to approximately −100 MPa, from approximately −600 MPa to approximately −300 MPa, from approximately −600 MPa to approximately −500 MPa, such as approximately −550 MPa. The as-deposited diamond-like carbon film may have a density (g/cc) of greater than 1.8 g/cc, for example approximately 2.0 g/cc or higher, approximately 2.5 g/cc or higher, such as from about 1.8 g/cc to about 2.5 g/cc. The as-deposited diamond-like carbon film may film has an elastic modulus (GPa) of greater than 150 GPa, for example, from about 200 to about 400 GPa.

Figure 3:
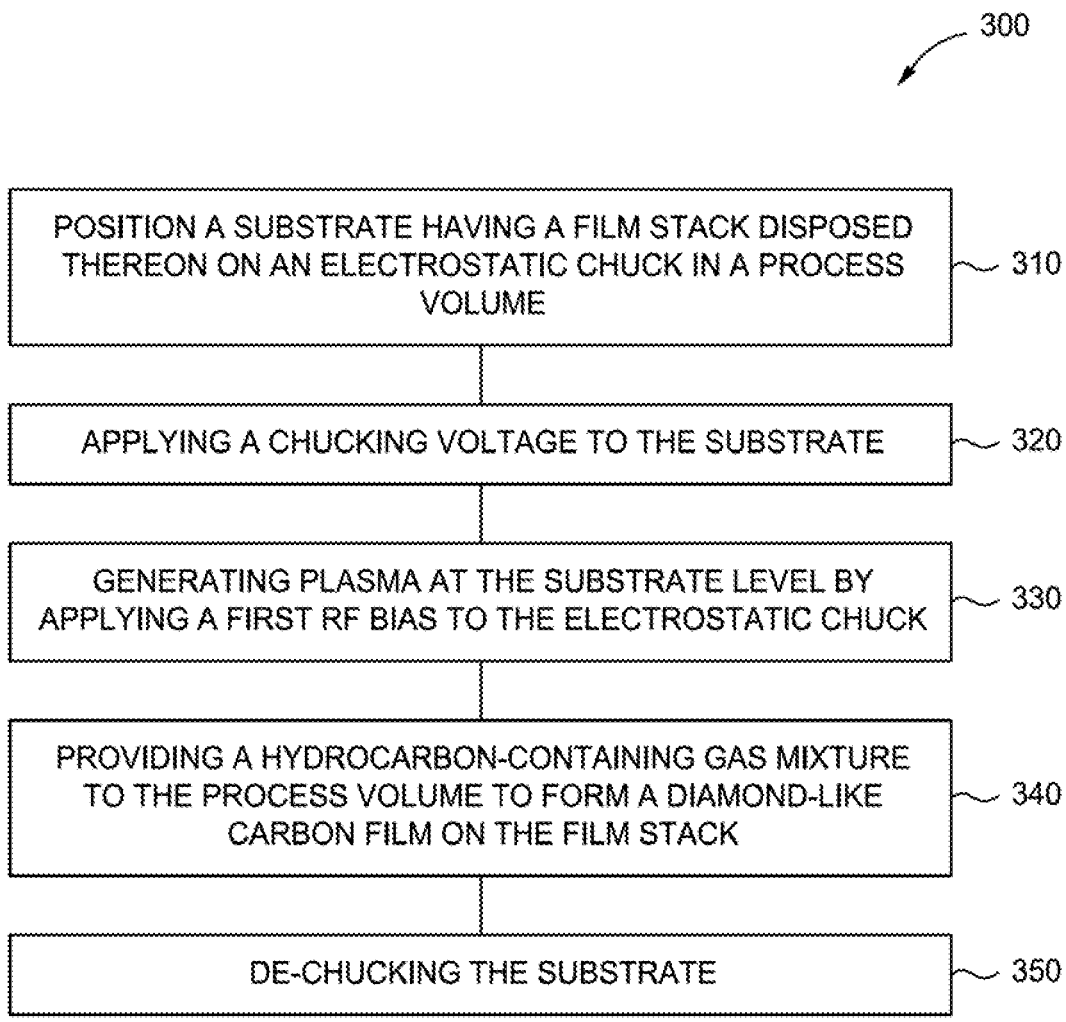
FIG. 3 depicts a flow diagram of a method for forming a diamond-like carbon layer on a film stack disposed on a substrate in accordance with one or more implementations of the present disclosure.
Figure 4A:
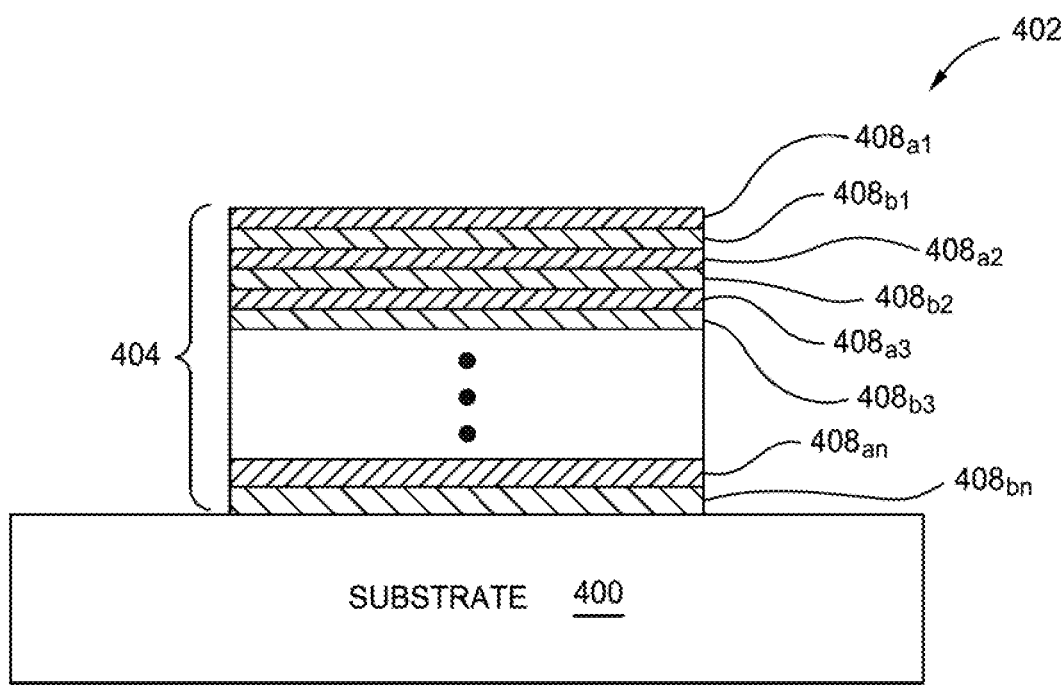
FIGS. 4A-4B depict one implementation of a sequence for forming a diamond-like carbon layer on a film stack formed on a substrate in accordance with one or more implementations of the present disclosure.
Figure 4B:
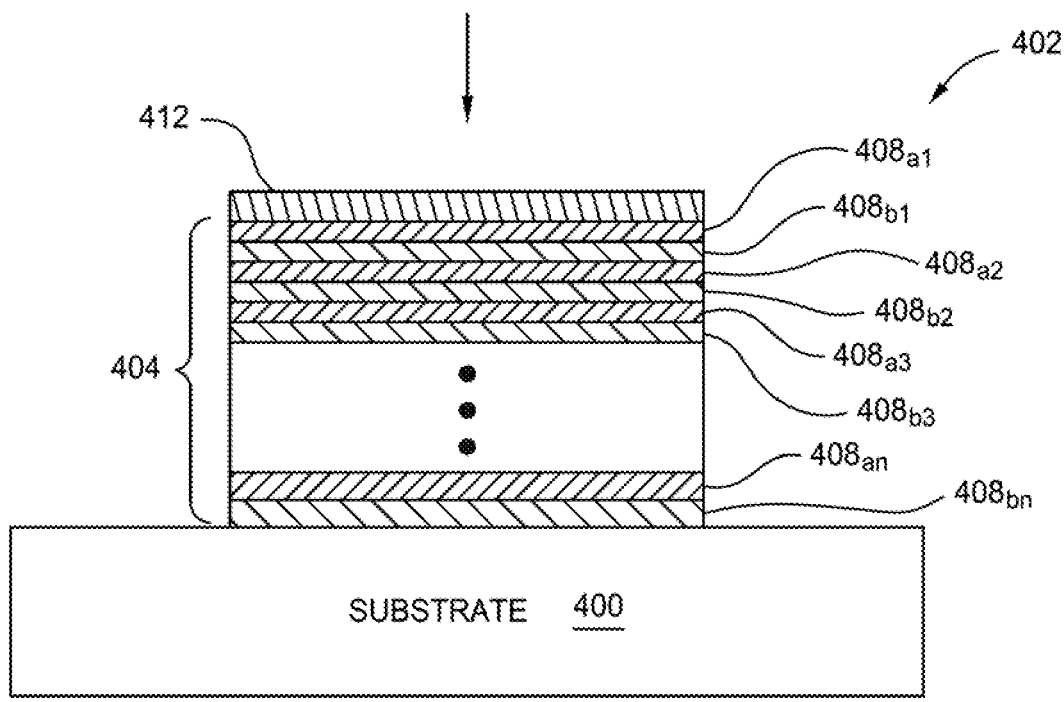

FIG. 3 depicts a flow diagram of a method 300 for forming a diamond-like carbon layer on a film stack disposed on a substrate in accordance with one implementation of the present disclosure. The diamond-like carbon layer formed on a film stack may be utilized, for example, as a hardmask to form stair-like structures in the film stack. FIGS. 4A-4B are schematic cross-sectional views illustrating a sequence for forming a diamond-like carbon layer on a film stack disposed on a substrate according to the method 300. Although the method 300 is described below with reference to a hardmask layer that may be formed on a film stack utilized to manufacture stair-like structures in the film stack for three dimensional semiconductor devices, the method 300 may also be used to advantage in other device manufacturing applications. Further, it should also be understood that the operations depicted in FIG. 3 may be performed simultaneously and/or in a different order than the order depicted in FIG. 3.

The method 300 begins at operation 310 by positioning a substrate, such as a substrate 400 depicted in FIG. 4A, into a process chamber, such as the process chamber 100 depicted in FIG. 1A or FIG. 1B. The substrate 400 may be substrate 190 depicted in FIG. 1A, FIG. 1B and FIG. 2. The substrate 400 may be positioned on an electrostatic chuck, for example, the upper surface 192 of the electrostatic chuck 150. The substrate 400 may be a silicon-based material or any suitable insulating material or conductive material as needed, having a film stack 404 disposed on the substrate 400 that may be utilized to form a structure 402, such as stair-like structures, in the film stack 404.

As shown in the exemplary implementation depicted in FIG. 4A, the substrate 400 may have a substantially planar surface, an uneven surface, or a substantially planar surface having a structure formed thereon. The film stack 404 is formed on the substrate 400. In one implementation, the film stack 404 may be utilized to form a gate structure, a contact structure or an interconnection structure in a front end or back end process. The method 300 may be performed on the film stack 404 to form the stair-like structures therein used in a memory structure, such as NAND structure. In one implementation, the substrate 400 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 400 may have various dimensions, such as 200 mm, 300 mm, and 450 mm or other diameter substrates, as well as, rectangular or square panels. Unless otherwise noted, implementations and examples described herein are conducted on substrates with a 200 mm diameter, a 300 mm diameter, or a 450 mm diameter substrate. In the implementation wherein a SOI structure is utilized for the substrate 400, the substrate 400 may include a buried dielectric layer disposed on a silicon crystalline substrate. In the implementation depicted herein, the substrate 400 may be a crystalline silicon substrate.

In one implementation, the film stack 404 disposed on the substrate 400 may have a number of vertically stacked layers. The film stack 404 may comprise pairs including a first layer (shown as $408a_1$, $408a_2$, $408a_3$, . . . , $408a_n$) and a second layer (shown as $408b_1$, $408b_2$, $408b_3$, . . . , $408b_n$) repeatedly formed in the film stack 404. The pairs includes alternating first layer (shown as $408a_1$, $408a_2$, $408a_3$, . . . , $408a_n$) and second layer (shown as $408b_1$, $408b_2$, $408b_3$, . . . , $408b_n$) repeatedly formed until desired numbers of pairs of the first layers and the second layers are reached.

The film stack 404 may be a part of a semiconductor chip, such as a three-dimensional memory chip. Although three repeating layers of first layers (shown as $408a_1$, $408a_2$, $408a_3$, . . . , $408a_n$) and second layers (shown as $408b_1$, $408b_2$, $408b_3$, . . . , $408b_n$) are shown in FIGS. 4A-4B, it is noted that any desired number of repeating pairs of the first and the second layers may be utilized as needed.

In one implementation, the film stack 404 may be utilized to form multiple gate structures for a three-dimensional memory chip. The first layers $408a_1$, $408a_2$, $408a_3$, ..., $408a_n$, formed in the film stack 404 may be a first dielectric layer and the second layers $408b_1$, $408b_2$, $408b_3$, ..., $408b_n$ may be a second dielectric layer. Suitable dielectric layers may be utilized to form the first layers $408a_1$, $408a_2$, $408a_3$, ..., $408a_n$ and the second layer $408b_1$, $408b_2$, $408b_3$, ..., $408b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some implementations, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $408a_1$, $408a_2$, $408a_3$, ..., $408a_n$ are silicon oxide layers and the second layers $408b_1$, $408b_2$, $408b_3$, ..., $408b_n$ are silicon nitride layers or polysilicon layers disposed on the first layers $408a_1$, $408a_2$, $408a_3$, ..., $408a_n$. In one implementation, the thickness of first layers $408a_1$, $408a_2$, $408a_3$, ..., $408a_n$ may be controlled at between about 50 Å and about 1000 Å, such as about 500 Å, and the thickness of the each second layers $408b_1$, $408b_2$, $408b_3$, ..., $408b_n$ may be controlled at between about 50 Å and about 1000 Å, such as about 500 Å. The film stack 404 may have a total thickness between about 100 Å and about 2000 Å. In one implementation, a total thickness of the film stack 404 is about 3 microns to about 10 microns and will vary as technology advances.

It is noted that the diamond-like carbon layer may be formed on any surfaces or any portion of the substrate 400 with or without the film stack 404 present on the substrate 400.

At operation 320, a chucking voltage is applied to the electrostatic chuck to clamp the substrate 400 to the electrostatic chuck. In some implementations, where the substrate 400 is positioned on the upper surface 192 of the electrostatic chuck 150, the upper surface 192 provides support and clamps the substrate 400 during processing. The electrostatic chuck 150 flattens the substrate 400 closely against the upper surface 192, preventing backside deposition. An electrical bias is provided to the substrate 400 via chucking electrode 210. The chucking electrode 210 may be in electronic communication with the chucking power source 212 that supplies a biasing voltage to the chucking electrode 210. In one implementation, the chucking voltage is between about 10 volts and about 3000 volts. In one implementation, the chucking voltage is between about 100 volts and about 2000 volts. In one implementation, the chucking voltage is between about 200 volts and about 1000 volts.

During operation 320, several process parameters may be regulated the process. In one implementation suitable for processing a 300 mm substrate, the process pressure in the processing volume may be maintained at about 0.1 mTorr to about 10 Torr (e.g., about 2 mTorr to about 50 mTorr; or about 5 mTorr to about 20 mTorr). In one implementation suitable for processing a 300 mm substrate, the processing temperature and/or substrate temperature may be maintained at about −50 degrees Celsius to about 350 degrees Celsius (e.g., about 0 degrees Celsius to about 50 degrees Celsius; or about 10 degrees Celsius to about 20 degrees Celsius).

In one implementation, a constant chucking voltage is applied to the substrate 400. In one implementation, the chucking voltage may be pulsed to the electrostatic chuck 150. In some implementations, a backside gas may be applied to the substrate 400 while applying the chucking voltage to control the temperature of the substrate. Backside gases may include but are not limited to, helium (He), argon (Ar), or the like.

At operation 330, a plasma is generated at the substrate level by applying a first RF bias to the electrostatic chuck. Plasma generated at the substrate level may be generated in a plasma region between the substrate and the electrostatic chuck. The first RF bias may be from about 10 Watts and about 3000 Watts at a frequency of from about 350 KHz to about 100 MHz (e.g., 350 KHz, 2 MHz, 13.56 MHz, 27 MHz, 40 MHz, 60 MHz, or 100 MHz). In one implementation, the first RF bias is provided at a power between about 2500 Watts and about 3000 Watts at a frequency of about 13.56 MHz. In one implementation, the first RF bias is provided to the electrostatic chuck 150 via the second RF electrode 260. The second RF electrode 260 may be in electronic communication with the first RF power source 230 that supplies a biasing voltage to the second RF electrode 260. In one implementation, the bias power is between about 10 Watts and about 3000 Watts. In one implementation, the bias power is between about 2000 Watts and about 3000 Watts. In one implementation, the bias power is between about 2500 Watts and about 3000 Watts. The first RF power source 230 may produce power at a frequency of from about 350 KHz to about 100 MHz (e.g., 350 KHz, 2 MHz, 13.56 MHz, 27 MHz, 40 MHz, 60 MHz, or 100 MHz).

In some implementations, operation 330 further comprises applying a second RF bias to the electrostatic chuck. The second RF bias may be from about 10 Watts and about 3000 Watts at a frequency of from about 350 KHz to about 100 MHz (e.g., 350 KHz, 2 MHz, 13.56 MHz, 27 MHz, 40 MHz, 60 MHz, or 100 MHz). In one implementation, the second RF bias is provided at a power between about 800 Watts and about 1200 Watts at a frequency of about 2 MHz. In one implementation, the second RF bias is provided to the substrate 400 via the chucking electrode 210. The chucking electrode 210 may be in electronic communication with second RF power source 240 that supplies a biasing voltage to the chucking electrode 210. In one implementation, the bias power is between about 10 Watts and about 3000 Watts. In one implementation, the bias power is between about 500 Watts and about 1500 Watts. In one implementation, the bias power is between about 800 Watts and about 1200 Watts. The second RF power source 240 may produce power at a frequency of from about 350 KHz to about 100 MHz (e.g., 350 KHz, 2 MHz, 13.56 MHz, 27 MHz, 40 MHz, 60 MHz, or 100 MHz). In one implementation, the chucking voltage supplied in operation 320 is maintained during operation 330.

In some implementations, during operation 330, the first RF bias is provided to the substrate 400 via the chucking electrode 210 and the second RF bias may be provided to the substrate 400 via the second RF electrode 260. In one implementation, the first RF bias is about 2500 Watts (13.56 MHz) and the second RF bias is about 1000 Watts (2 MHz).

During operation 340, a hydrocarbon-containing gas mixture is flowed into the processing volume 126 to form the diamond-like carbon film on the film stack. The hydrocarbon-containing gas mixture may be flowed from the gas panel 130 into the processing volume 126 either through the gas distribution assembly 120 or via the sidewall 101. The hydrocarbon-containing gas mixture may include at least one hydrocarbon compound. The hydrocarbon-containing gas mixture may further include an inert gas, a dilution gas, a nitrogen-containing gas, an etchant gas or combinations thereof. The hydrocarbon can be any liquid or gas, though the preferred precursor would be vapor at room temperature to simplify the hardware needed for material metering, control and delivery to the chamber. In some implementations, the chucking voltage supplied during operation 320 is maintained during operation 340. In some implementations, the process conditions established during operation 320 and plasma formed during operation 330 are maintained during operation 340.

In one implementation, the hydrocarbon compound is a gaseous hydrocarbon. In one implementation, the hydrocarbon compound has a general formula $C_xH_y$, where x has a range of between 1 and 20 and y has a range of between 1 and 20. Suitable hydrocarbon compounds include, for example, $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof. In one example, $C_2H_2$ is preferable due to formation of more stable intermediate species, which allows more surface mobility.

In one implementation, the hydrocarbon compound is an alkane (e.g., $C_nH_{2n+2}$, wherein n is between 1 and 20). Suitable hydrocarbon compounds include, for example, alkanes such as methane ($CH_4$), ethane ($C_2H_6$), propylene ($C_3H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or combinations thereof.

In one implementation, the hydrocarbon compound is an alkene (e.g., $C_nH_{2n}$, wherein n is between 1 and 20). Suitable hydrocarbon compounds include, for example, alkenes such as ethylene, propylene, butylene and its isomers, pentene and its isomers, and the like, dienes such as butadiene, isoprene, pentadiene, hexadiene, or combinations thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or combinations thereof.

In one implementation, the hydrocarbon compound is an alkyne (e.g., $C_nH_{2n-2}$, wherein n is between 1 and 20). Suitable hydrocarbon compounds include, for example, alkynes such as acetylene ($C_2H_2$), propyne ($C_3H_4$), butylene ($C_4H_8$), vinylacetylene, or combinations thereof.

In one implementation, the hydrocarbon compound is an aromatic hydrocarbon compound, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof.

In some implementations, the hydrocarbon-containing gas mixture further comprises one or more dilution gases. Suitable dilution gases such as helium (He), argon (Ar), xenon (Xe). hydrogen ($H_2$), nitrogen ($N_2$), ammonia ($NH_3$), or combinations thereof, among others, may be added to the gas mixture, if desired. Ar, He, and $N_2$ are used to control the density and deposition rate of the diamond-like carbon layer. In some cases, the addition of $N_2$ and/or $NH_3$ can be used to control the hydrogen ratio of the diamond-like carbon layer, as discussed below. Alternatively, dilution gases may not be used during the deposition.

In some implementations, the hydrocarbon-containing gas mixture further comprises one or more nitrogen-containing gases. Suitable nitrogen-containing compounds include, for example, pyridine, aliphatic amine, amines, nitriles, ammonia and similar compounds.

In some implementations, the hydrocarbon-containing gas mixture further comprises an inert gas. In some implementations, an inert gas, such as argon (Ar) and/or helium (He) may be supplied with the hydrocarbon-containing gas mixture into the processing volume 126. Other inert gases, such as nitrogen ($N_2$) and nitric oxide (NO), may also be used to control the density and deposition rate of the diamond-like carbon layer. Additionally, a variety of other processing gases may be added to the hydrocarbon-containing gas mixture to modify properties of the diamond-like carbon material. In one implementation, the other processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited diamond-like carbon layer. The hydrogen ratio present in the diamond-like carbon film provides control over layer properties, such as reflectivity.

In some implementations, the hydrocarbon-containing gas mixture further comprises an etchant gas. Suitable etchant gases include chlorine ($Cl_2$), carbon tetrafluoride ($CF_4$), nitrogen trifluoride ($NF_3$), or combinations thereof. Not to be bound by theory, but it is believed that the etchant gases selectively etch $sp^2$ hybridized carbon atoms from the film thus increasing the fraction of $sp^3$ hybridized carbon atoms in the film, which increases the etch selectivity of the film.

In some implementation, after the diamond-like carbon layer 412 is formed on the substrate during operation 340, the diamond-like carbon layer 412 is exposed to hydrogen radicals. In some implementations, the diamond-like carbon layer is exposed to hydrogen radicals during the deposition process of operation 340. In some implementations, the hydrogen radicals formed in an RPS and delivered to the processing region. Not to be bound by theory, but it is believed that exposing the diamond-like carbon layer to hydrogen radicals leads to selective etching of $sp^2$ hybridized carbon atoms thus increasing the $sp^3$ hybridized carbon atom fraction of the film, thus increasing the etch selectivity.

At operation 350, after the diamond-like carbon layer 412 is formed on the substrate, the substrate is de-chucked. During operation 350, the chucking voltage is turned-off. The reactive gases are turned-off and optionally purged from the processing chamber. In one implementation, during operation 350 RF power is reduced (e.g., ~200 W). Optionally, the controller 110 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

Figure 8:
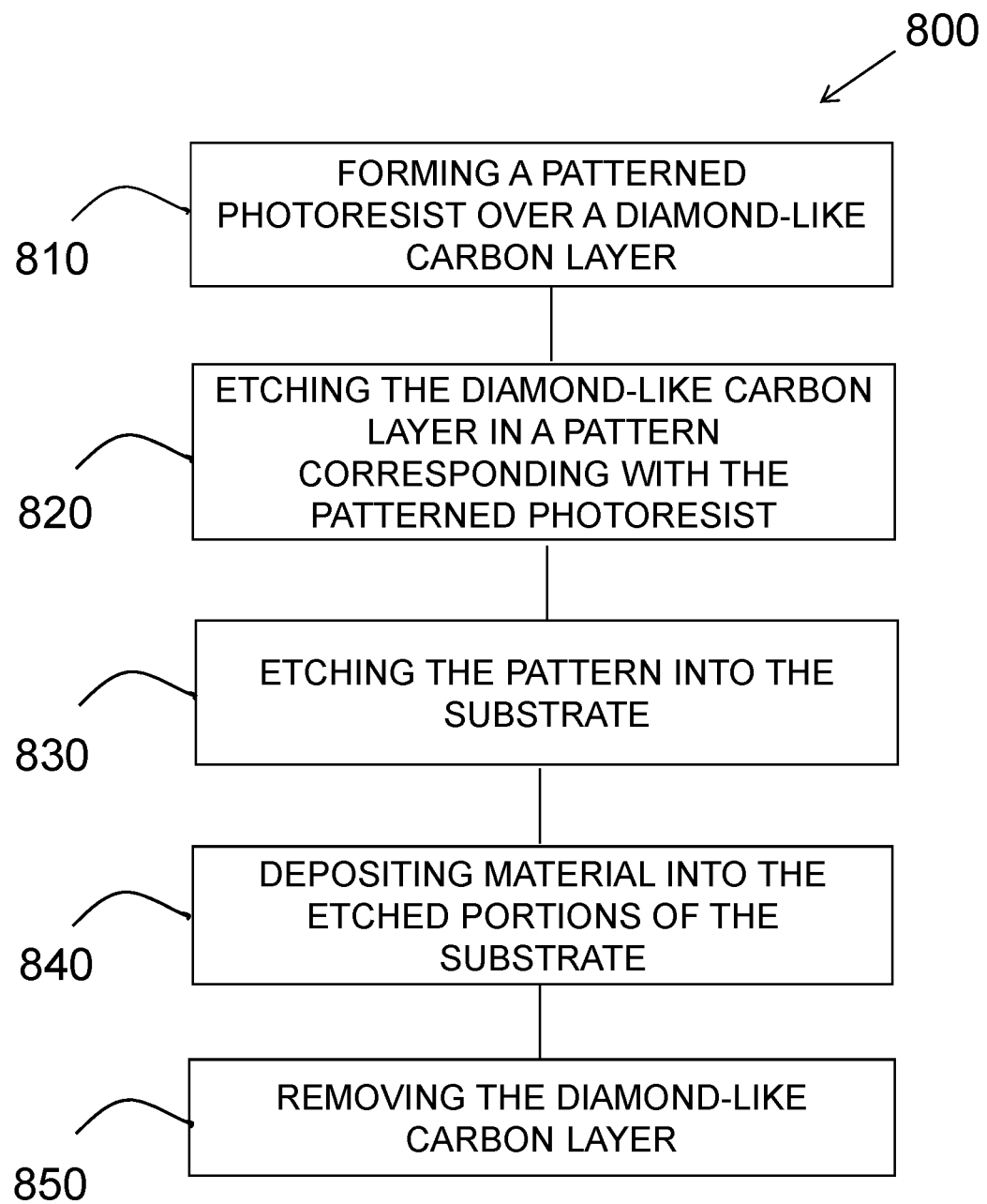
FIG. 8 depicts a flow diagram of a method of using a diamond-like carbon layer in accordance with one or more implementations of the present disclosure.

FIG. 8 depicts a flow diagram of a method 800 of using a diamond-like carbon layer in accordance with one or more implementations of the present disclosure. After the diamond-like carbon layer 412 is formed on the substrate, the diamond-like carbon layer 412 may be utilized in an etching process as a patterning mask to form a three-dimensional structure, such as a stair like structure. The diamond-like carbon layer 412 may be patterned using a standard photoresist patterning techniques. At operation 810, a patterned photoresist (not shown) may be formed over the diamond-like carbon layer 412. At operation 820, the diamond-like carbon layer 412 may be etched in a pattern corresponding with the patterned photoresist layer followed by etching the pattern into the substrate 400 at operation 830. At operation 840, material may be deposited into the etched portions of the substrate 400. At operation 850, the diamond-like carbon layer 412 may be removed using a solution comprising hydrogen peroxide and sulfuric acid. One exemplary solution comprising hydrogen peroxide and sulfuric acid is known as Piranha solution or Piranha etch. The diamond-like carbon layer 412 may also be removed using etch chemistries containing oxygen and halogens (e.g., fluorine or chlorine), for example, $Cl_2/O_2$, $CF_4/O_2$, $Cl_2/O_2/CF_4$. The diamond-like carbon layer 412 may be removed by a chemical mechanical polishing (CMP) process.

EXAMPLES

The following non-limiting examples are provided to further illustrate implementations described herein. However, the examples are not intended to be all inclusive and are not intended to limit the scope of the implementations described herein.

In one implementation, a low stress, high-density diamond-like carbon film of the present disclosure was fabricated by flowing 150 sccm $C_2H_2$ and 100 sccm He as process gases at a temperature of 10 degrees Celsius, applying 2500 Watts RF (13.56 MHz) power and 1000 Watts (2 MHz) through the substrate pedestal (electrostatic chuck) in a CVD reactor with Ar and/or He as diluting gas. The resultant diamond-like carbon film had a density of 1.94 g/cc and stress of −350 MPa and an etch selectivity greater than currently available amorphous carbon films.

TABLE II

| Film Type | Amorphous Carbon Film Reference | PVD Diamond-Like Carbon Film Reference | PECVD Diamond-like carbon film |
|---|---|---|---|
| Density (g/cc) | 1.75 | 2.52 | ~2.00 |
| Stress (MPa) | −50 | −350 | −600 |
| n @ 633 nm | 2.07 | >2.3 | 2.37 |
| k @ 633 nm | 0.63 | >0.5 | 0.30 |
| H content (% RBS) | 12 | <1% | 25 |
| $sp^3$ % | <10% | ~50% | ~60% |
| Modulus/Hardness (GPa) | 53/5.8 | 231/19 | 180/20 |
| Temperature | 635 | 25 | 10 |

Figure 5:
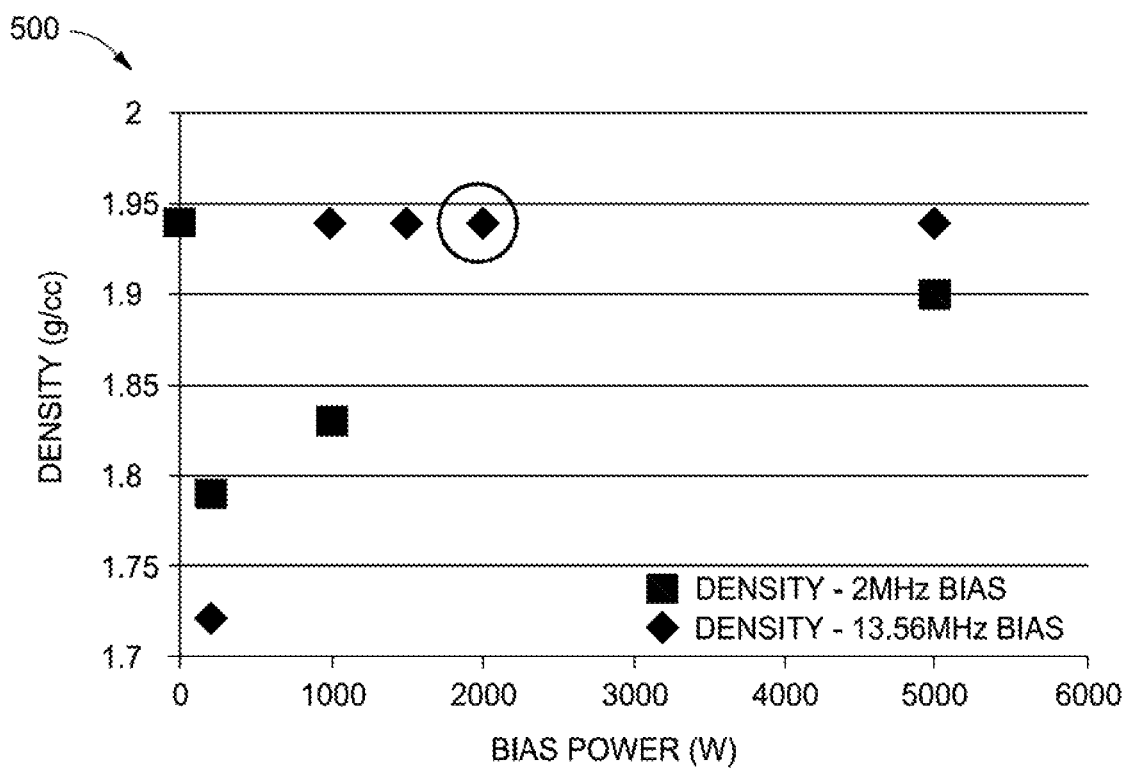
FIG. 5 is a graph depicting density as a function of bias power for a diamond-like carbon layer formed in accordance with one or more implementations of the present disclosure.

FIG. 5 is a graph 500 depicting density as a function of bias power for a diamond-like carbon layer formed in accordance with one or more implementations of the present disclosure. The graph 500 depicts density as a function of bias power for diamond-like carbon films deposited at a frequency of 2 MHz and a frequency of 13.56 MHz. The y-axis represents the density (g/cc) of the deposited films and the x-axis represents the bias power (Watts). As illustrated in FIG. 5, for the most part, as bias power increases, the density of the as-deposited film increases.

Figure 6:
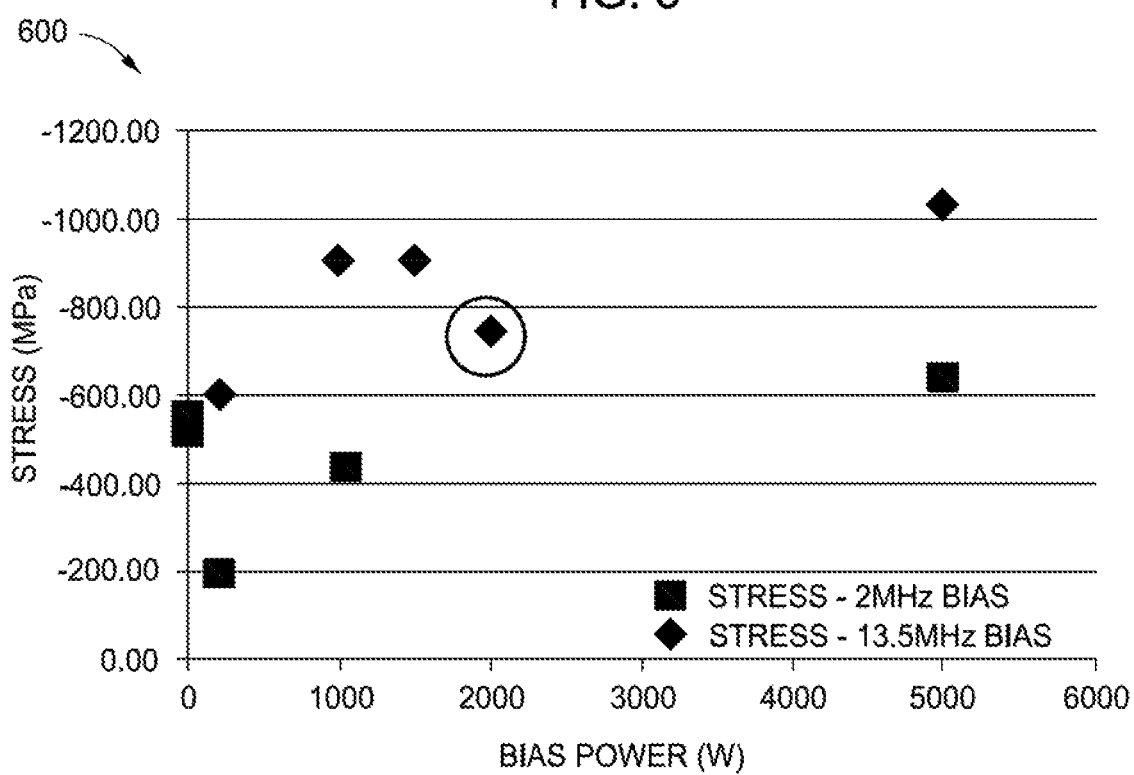
FIG. 6 is a graph depicting stress as a function of bias power for a diamond-like carbon layer formed in accordance with one or more implementations of the present disclosure.

FIG. 6 is a graph 600 depicting stress as a function of bias power for a diamond-like carbon layer formed in accordance with one or more implementations of the present disclosure.

The graph 600 depicts stress as a function of bias power for diamond-like carbon films deposited at a frequency of 2 MHz and a frequency of 13.56 MHz. The y-axis represents the stress (MPa) of the deposited films and the x-axis represents the bias power (Watts). As illustrated in FIG. 6, for the most part, as bias power increases, the stress of the as-deposited film increases.

Figure 7:
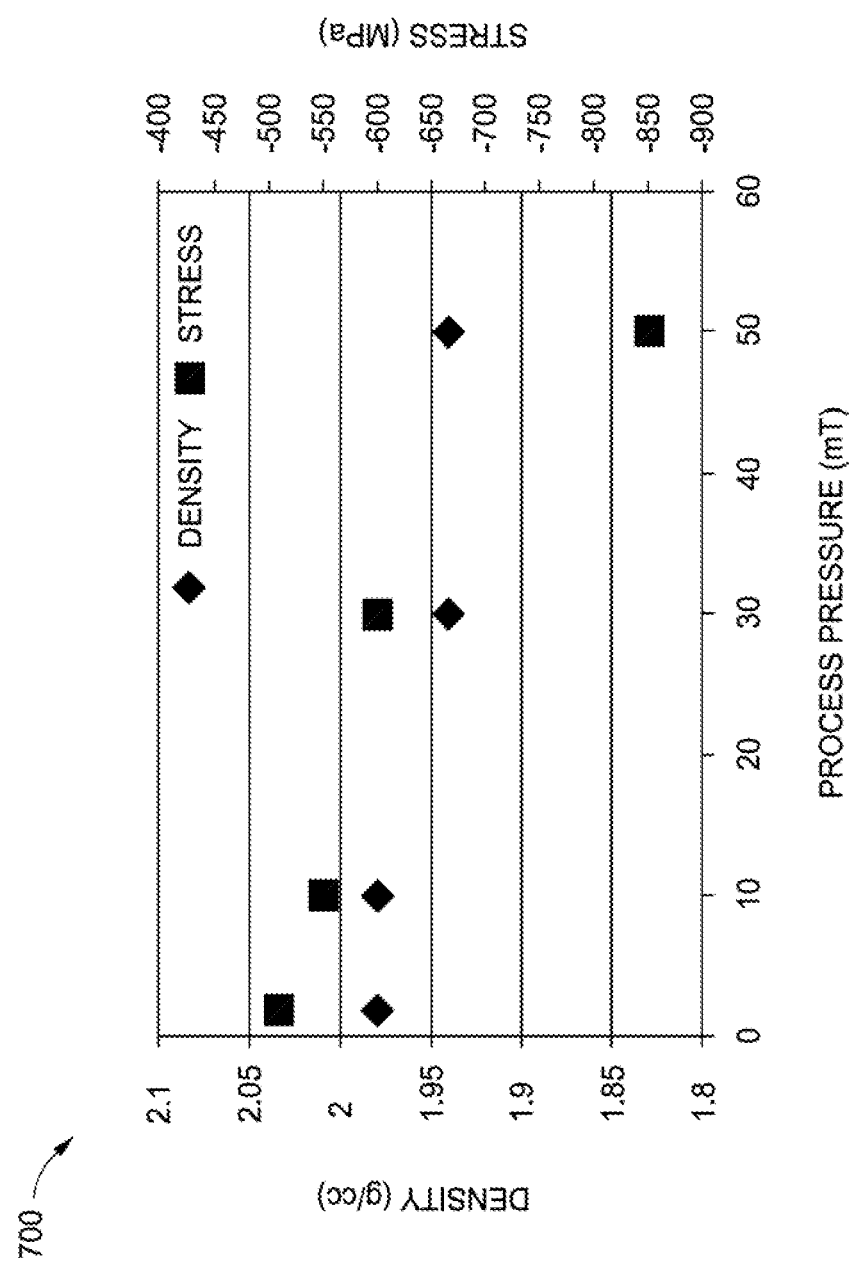
FIG. 7 is a graph depicting density and stress as a function of pressure for a diamond-like carbon layer formed in accordance with one or more implementations of the present disclosure.

FIG. 7 is a graph 700 depicting density and stress as a function of pressure for a diamond-like carbon layer formed in accordance with one or more implementations of the present disclosure. The y-axis represents the density (g/cc) and stress (MPa) of the deposited films and the x-axis represents the process pressure (mTorr). As illustrated in FIG. 7, lower pressure yields a slightly higher density and lower stress and higher pressure yields more compressive stress.

Extreme Ultraviolet ("EUV") Patterning Schemes

The choice of underlayer is critical to preventing nanofailures (e.g., bridging defects and spacing defects) in semiconductor devices when using metal-containing photoresists in extreme ultraviolet ("EUV") patterning schemes. Conventional underlayers for EUV patterning (lithography) schemes are spin on carbon (SOC) materials. However, during patterning, metals such as tin, for example, diffuse through the SOC material leading to nanofailures in the semiconductor devices. Such nanofailures act to reduce, degrade, and hamper semiconductor performance.

The high-density carbon films described herein, on the other hand, have superior film qualities such as improved hardness and density. Such hardness and density allow the high-density carbon film to act as a stronger barrier against metal infiltration and to prevent and at a minimum, reduce nanofailures to a greater extent than the conventional SOC films.

In some implementations, a film for use as an underlayer for an extreme ultraviolet ("EUV") lithography process is provided. In some implementations, the film (and/or as-deposited film) has one or more of the following characteristics:

1) A quantity/percentage of $sp^3$ hybridized carbon atoms (i.e., a $sp^3$ hybridized carbon atom content) that is at least 40, 45, 50, 55, 60, 65, 70, 75, 80, or 85 percent based on the total amount of carbon atoms in the as-deposited film. In these or other implementations, the quantity/percentage of $sp^3$ hybridized carbon atoms is up to 45, 50, 55, 60, 65, 70, 75, 80, 85, or 90 percent based on the total amount of carbon atoms in the as-deposited film. In these or other implementations, the quantity/percentage of $sp^3$ hybridized carbon atoms is from about 50 to about 90 percent (such as from about 60 to about 70 percent) based on the total amount of carbon atoms in the as-deposited film.

2) A thickness that is between about 5 Å and about 20,000 Å (e.g., between about 300 Å to about 5000 Å, such as between about 2000 Å and about 3000 Å). Alternately, a thickness that is between about 5 Å to about 200 Å.

3) A refractive index or n-value (n (at 633 nm)) that is greater than 2.0, for example, approximately 2.0 to approximately 3.0, such as 2.3.

4) An extinction coefficient or k-value (K (at 633 nm)) that is greater than 0.1, for example, approximately 0.2 to approximately 0.3, such as 0.25.

5) A stress (MPa) that is less than about −300 MPa, for example from approximately −600 MPa to approximately −300 MPa, from approximately −600 MPa to approximately −500 MPa, such as approximately −550 MPa.

6) A density (g/cc) that is greater than 1.8 g/cc, for example approximately 2.0 g/cc or higher, approximately 2.5 g/cc or higher, such as from about 1.8 g/cc to about 2.5 g/cc.

7) An elastic modulus (GPa) that is greater than 150 GPa, for example, from about 200 to about 400 GPa.

In some implementations, a film for use as an underlayer for an EUV lithography process can be any film described herein.

In some implementations, a film for use as an underlayer for an EUV lithography process has an $sp^3$ hybridized carbon atom content of between 40% and 90% based on the total amount of carbon atoms in the film; a density of between 1.8 g/cc and 2.5 g/cc; and an elastic modulus that is between 150 GPa and 400 GPa.

In some implementations, a film for use as an underlayer for an EUV lithography process has a density of between 2.0 g/cc and 2.2 g/cc; and an elastic modulus that is between about 180 GPa and about 200 GPa. In some implementations, the film has a density of about 2.1 g/cc and an elastic modulus of about 195 GPa.

In some implementations, for use as an underlayer for an EUV lithography process has a stress of −600 MPa; a refractive index that is between 2.0 and 3.0; and an extinction coefficient of between 0.2 and 0.3.

Thus, methods and apparatus for forming a diamond-like carbon hardmask layer that may be utilized to form stair-like structures for manufacturing three-dimensional stacking of semiconductor devices are provided. By utilization of the diamond-like hardmask layer with desired robust film properties and etching selectivity, an improved dimension and profile control of the resultant structures formed in a film stack may be obtained and the electrical performance of the chip devices may be enhanced in applications for three-dimensional stacking of semiconductor devices.

In summary, some of the benefits of the present disclosure provide a process for depositing diamond-like hardmask films on a substrate. Typical PECVD hardmask films have a very low percent of hybridized $sp^3$ atoms and hence low modulus and etch selectivity. In some implementations described herein, low process pressures (mTorr vs. Torr) and bottom driven plasma enables fabrication of films with approximately 60% or greater hybridized $sp^3$ atoms, which results in an improvement in etch selectivity relative to previously available hardmask films. In addition, some of the implementations described herein are performed at low substrate temperatures, which enable the deposition of other dielectric films at much lower temperatures than currently possible, opening up applications with low thermal budget that could not be currently addressed by CVD. Additionally, some of the implementations described herein may be used as an underlayer for an EUV lithography process.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
flowing a hydrocarbon-containing gas mixture into a processing volume of a process chamber having the substrate positioned on an electrostatic chuck, wherein the substrate is maintained at a pressure between 0.5 mTorr and 10 mTorr, and wherein the hydrocarbon-containing gas mixture comprises a hydrocarbon precursor selected from the group consisting of: $C_2H_2$, $C_3H_6$, $CH_4$, $C_4H_8$, bicyclo[2.2.1]hepta-2,5-diene (2,5-Norbornadiene), norbornene ($C_7H_{10}$), or a combination thereof; and
generating a plasma at the substrate level by applying a first RF bias to the electrostatic chuck to deposit a diamond-like carbon film on the substrate from the hydrocarbon-containing gas mixture, wherein the diamond-like carbon film has a density greater than 1.8 g/cc, a stress less than −500 MPa, wherein the diamond-like carbon film contains from 50 percent to 90 percent of $sp^3$ hybridized carbon atoms, and wherein the substrate is maintained at a temperature from 10° C. to 50° C.

2. The method of claim 1, wherein generating the plasma at the substrate level further comprises applying a second RF bias to the electrostatic chuck.

3. The method of claim 2, wherein the first RF bias is provided at a power between 10 Watts and 3000 Watts at a frequency of from 350 KHz to 100 MHz.

4. The method of claim 3, wherein the first RF bias is provided at a power between 2500 Watts and 3000 Watts at a frequency of 13.56 MHz.

5. The method of claim 4, wherein the second RF bias is provided at a power between 10 Watts and 3000 Watts at a frequency of from 350 KHz to 100 MHz.

6. The method of claim 5, wherein the second RF bias is provided at a power between 800 Watts and 1200 Watts at a frequency of 2 MHz.

7. The method of claim 1, further comprising applying a chucking voltage to the substrate positioned on the electrostatic chuck.

8. The method of claim 1, wherein the diamond-like carbon film has an elastic modulus greater than 150 GPa.

9. The method of claim 1, wherein the hydrocarbon-containing gas mixture further comprises a dilution gas selected from the group consisting of: He, Ar, Xe, $N_2$, $H_2$, and combinations thereof.

10. A method of processing a substrate, comprising:
flowing a hydrocarbon-containing gas mixture into a processing volume of a process chamber having the substrate positioned on an electrostatic chuck, wherein the electrostatic chuck has a chucking electrode and an RF electrode separate from the chucking electrode, wherein the substrate is maintained at a pressure between 0.5 mTorr and 10 Torr, and wherein the hydrocarbon-containing gas mixture consists of acetylene ($C_2H_2$) and optionally a dilution gas selected from the group consisting of He, Ar, Xe, $N_2$, $H_2$, or a combination thereof; and
generating a plasma at the substrate level by applying a first RF bias to the RF electrode and a second RF bias to the chucking electrode to deposit a diamond-like carbon film on the substrate from the hydrocarbon-containing gas mixture, wherein the diamond-like carbon film has a density from 1.8 g/cc to 2.5 g/cc, a stress from −600 MPa to −300 MPa, and wherein the diamond-like carbon film contains from 50 percent to 90 percent of $sp^3$ hybridized carbon atoms.

11. The method of claim 10, wherein the first RF bias is provided at a power between 2500 Watts and 3000 Watts at a frequency of about 13.56 MHz and the second RF bias is provided at a power between 800 Watts and 1200 Watts at a frequency of 2 MHz.

12. The method of claim 10, wherein the diamond-like carbon film is used as an underlayer in an extreme ultraviolet ("EUV") lithography process.

13. A method of processing a substrate, comprising:
flowing a hydrocarbon-containing gas mixture into a processing volume of a process chamber having the substrate positioned on an electrostatic chuck, wherein the electrostatic chuck has a chucking electrode and an RF electrode separate from the chucking electrode, wherein the processing volume is maintained at a pressure between 0.5 mTorr and 10 Torr, and wherein the hydrocarbon-containing gas mixture comprises a hydrocarbon precursor selected from the group consisting of: $C_2H_2$, $C_3H_6$, $CH_4$, $C_4H_8$, bicyclo[2.2.1]hepta-2,5-diene (2,5-Norbornadiene), norbornene ($C_7H_{10}$), or a combination thereof;
generating a plasma at the substrate level by applying a first RF bias to the RF electrode and a second RF bias to the chucking electrode to deposit a diamond-like carbon film on the substrate from the hydrocarbon-containing gas mixture, wherein the diamond-like carbon film has a density from 1.8 g/cc to 2.5 g/cc, a stress from −600 MPa to −300 MPa, and wherein the diamond-like carbon film contains from 50 percent to 90 percent of $sp^3$ hybridized carbon atoms;
forming a patterned photoresist layer over the diamond-like carbon film;
etching the diamond-like carbon film in a pattern corresponding with the patterned photoresist layer; and
etching the pattern into the substrate.

14. The method of claim 13, wherein the first RF bias is provided at a power between 10 Watts and 3000 Watts at a frequency of from 350 KHz to 100 MHz.

15. The method of claim 14, wherein the first RF bias is provided at a power between 2500 Watts and 3000 Watts at a frequency of 13.56 MHz.

16. The method of claim 15, wherein the second RF bias is provided at a power between 10 Watts and 3000 Watts at a frequency of from 350 KHz to 100 MHz.

17. The method of claim 16, wherein the second RF bias is provided at a power between 800 Watts and 1200 Watts at a frequency of 2 MHz.

18. The method of claim 2, wherein the electrostatic chuck has a chucking electrode and an RF electrode and the first RF bias is applied to the RF electrode and the second RF bias is applied to the chucking electrode.

19. The method of claim 1, further comprising:
exposing the diamond-like carbon film to hydrogen radicals to selectively etch $sp^2$ hybridized carbon atoms.

* * * * *

UNITED STATES PATENT AND TRADEMARK OFFICE
CERTIFICATE OF CORRECTION

| | |
|---|---|
| PATENT NO. | : 11,043,372 B2 |
| APPLICATION NO. | : 15/979842 |
| DATED | : June 22, 2021 |
| INVENTOR(S) | : Eswaranand Venkatasubramanian et al. |

It is certified that error appears in the above-identified patent and that said Letters Patent is hereby corrected as shown below:

In the Claims

In Column 18, Line 7, in Claim 1, delete "10 mTorr," and insert -- 10 Torr, --, therefor.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*